United States Patent [19]

Chihara et al.

[11] Patent Number: 5,096,504

[45] Date of Patent: Mar. 17, 1992

[54] CLEANING AGENT FOR ROSIN-BASE SOLDER FLUX

[75] Inventors: Machio Chihara, Nara; Jiro Mizuya, Osaka; Tatsuya Okumura, Osaka; Takashi Tanaka, Osaka, all of Japan

[73] Assignee: Arakawa Chemical Industries, Ltd., Osaka, Japan

[21] Appl. No.: 538,622

[22] Filed: Jun. 15, 1990

[30] Foreign Application Priority Data

Nov. 8, 1989 [JP] Japan ................................. 1-291902

[51] Int. Cl.$^5$ ................................................ B08B 3/04
[52] U.S. Cl. ........................................................ 134/42
[58] Field of Search ................... 252/174.21, 174.22; 134/42

[56] References Cited

U.S. PATENT DOCUMENTS

| | | | |
|---|---|---|---|
| 3,886,099 | 5/1975 | Hale | 134/42 |
| 4,767,906 | 8/1988 | Takahashi et al. | 252/174.21 |
| 4,877,556 | 10/1989 | Wilsberg et al. | 252/174.21 |
| 4,934,391 | 6/1990 | Futch et al. | 252/174.21 |

*Primary Examiner*—Asok Pal
*Attorney, Agent, or Firm*—Armstrong, Nikaido, Marmelstein, Kubovcik & Murray

[57] ABSTRACT

The invention provides a cleaning agent for removal of a rosin-base flux, the cleaning agent consisting essentially of a surfactant represented by the formula $$R-O-(CH_2CH_2O)_n-H \qquad (I)$$

wherein R is a straight or branched chain alkyl or alkenyl group having 5 to 18 carbon atoms and n is an integer of 2 to 12, and a cleaning method for removing a rosin-base flux, the method comprising bringing the cleaning agent into contact with a flux on a printed wiring board.

9 Claims, No Drawings

CLEANING AGENT FOR ROSIN-BASE SOLDER FLUX

The present invention relates to a cleaning agent for removal of rosin-base solder fluxes and more particularly to a cleaning agent for removal of rosin-base solder fluxes for assembly.

A rosin-base solder flux is used in production of modules for printed circuit boards, printed wiring boards or the like. Generally soldering is conducted to promote the union between the substrate and pins and to prevent oxidation in contact points which impairs electrical conductivity. Rosin-base fluxes are employed to accomplish the soldering as desired. After soldering, a cleaning agent is used to remove only the flux selectively and completely. When the cleaning agent fails to completely remove the flux, the remaining flux adversely affects the soldering, giving disadvantages of circuit corrosion, reduction of electrical insulating properties of board surfaces or eventual breakdown of circuits. To eliminate such potential disadvantages, the residual flux, particularly the activator present therein, is usually removed by a proper cleaning agent.

Halogenated hydrocarbon solvents such as trichloroethylene, trichlorotrifluoroethane and like flons have been heretofore used as cleaning agents for removal of rosin-base fluxes. However, stringent regulations for control of such halogenated hydrocarbon solvents have been laid down to solve or alleviate the environmental pollution problems such as the depletion of ozone layer. Currently there is an urgent demand from the electric machine industry for development of cleaning agents for fluxes as a substitute for flons.

In recent years, various halogen-free cleaning agents for fluxes have been developed, but no cleaning agent has been provided which can completely fulfil all property requirements for cleaning agents including cleaning property, environmentally acceptable levels of toxicity, odor and inflammability, etc.

It is an object of the present invention to provide a halogen-free cleaning agent for removal of rosin-base fluxes which is excellent in a cleaning property and substantially satisfactory in characteristics meeting the environmental quality standard in respect of toxicity, odor and inflammability, etc.

We conducted extensive research to achieve the foregoing object and found that a cleaning agent consisting essentially of a specific surfactant surprisingly is free of all the above-mentioned problems. We have accomplished the present invention based on this novel finding.

According to the present invention, there is provided a cleaning agent for removal of a rosin-base flux, the cleaning agent consisting essentially of a surfactant represented by the formula $$R-O-(CH_2CH_2O)_n-H \quad (I)$$

wherein R is a straight or branched chain alkyl or alkenyl group having 5 to 18 carbon atoms and n is an integer of 2 to 12.

The present invention also provides a cleaning method for removing a rosin-base flux, the method comprising bringing the above cleaning agent into contact with the rosin-base flux on a substrate.

While the surfactant of the formula (I) for use herein is a known compound, it is surprisingly unexpected that this particular surfactant can be used singly as a cleaning agent for rosin-base fluxes.

The nonionic surfactant of the formula (I) for use as the sole active ingredient in the cleaning agent of the invention is an addition product of the corresponding alcohol (R—OH) and about 2 to about 12 moles of ethylene oxide. In the formula (I), R is a straight or branched chain alkyl or alkenyl group having 5 to 18, preferably 10 to 16 (particularly 10 to 14), carbon atoms, and n is an integer of 2 to 12, preferably 3 to 9. Consequently the corresponding alcohols (R—OH) are those in which R is a straight or branched chain alkyl or alkenyl group (particularly straight-chain alkyl or alkenyl or secondary alkyl or alkenyl group) having 5 to 18, preferably 10 to 16, carbon atoms.

Specific examples of the nonionic surfactant of the formula (I) are a pentyl alcohol-ethylene oxide adduct, hexyl alcohol-ethylene oxide adduct, heptyl alcohol-ethylene oxide adduct, octyl alcohol-ethylene oxide adduct, nonyl alcohol-ethylene oxide adduct, decyl alcohol-ethylene oxide adduct, lauryl alcohol-ethylene oxide adduct, oleyl alcohol-ethylene oxide adduct, stearyl alcohol-ethylene oxide adduct and the like, an adduct of ethylene oxide and the corresponding branched-chain primary or secondary alcohol which is an isomer each of the above-exemplified alcohols, etc. In the foregoing adducts, the average number of moles of ethylene oxide added is about 2 to about 12. These surfactants are usable singly or at least two of them can be used in a suitable combination.

In view of cleaning property, viscosity and solubility in water, preferred nonionic surfactants among those exemplified above are alcohol-ethylene oxide adducts in which the alkyl or alkenyl moiety of the alcohol is a straight or branched chain group having 10 to 16 carbon atoms and the average number of moles of ethylene oxide added is about 2 to about 12, preferably about 3 to about 9.

When the group R in the formula (I) has less than 5 carbon atoms, the cleaning property tends to decrease, whereas the cleaning agent with group R having over 18 carbon atoms tends to have lower solubility in water, consequently entailing difficulty in removal thereof by washing with water. The value n of less than 2, e.g. 1, is prone to result in reduced water-solubility and consequent insufficient removal upon washing with water. The value n of more than 12 is liable to increase the viscosity of the cleaning agent.

The above nonionic surfactants of the formula (I), which are all known, are commercially available or can be easily prepared from alcohol (R-H) and ethylene oxide by a process disclosed in, for example, "Gosei Kaimen Kasseizai (Synthetic surfactants)" authored by Hiroshi Horiguchi, published by Sankyo Shuppan on Apr. 1, 1960, pp. 336–341.

The cleaning agent of the invention is used for removing rosin-base fluxes, particularly those for assembly. Fluxes to be removed by the cleaning agent of the invention include inactive rosin fluxes consisting essentially of rosin, modified rosin or like rosin compound, and active rosin fluxes consisting essentially of such rosin compound and an activator such as triethanolamine hydrochloride, triethylene-tetramine hydrochloride, etc. Significant effect is produced by the cleaning agent of the invention especially when it is used for removing active fluxes for assembly.

The cleaning agent of the invention can be brought into contact with the rosin flux on a substrate by the following methods. The surfactant of the formula (I) as the cleaning agent of the invention is used as it is, or in the form of an aqueous solution having a concentration of the active ingredient of the formula (I) in the range of more than about 50% by weight but less than 100% by weight. When required, the cleaning agent of the invention may contain additives such as defoaming agent, anti-corrosion agent or the like. Such additive, if used, is added in an amount of about 0.1 wt % or less based on the weight of the cleaning agent of the invention. The substrate may be directly immersed in the surfactant of the formula (I) per se or in the aqueous solution thereof. Alternatively the surfactant of the formula (I) per se or an aqueous solution thereof may be sprayed over the substrate to flush it therewith or may be brought into contact with the flux on brushing by mechanical means. A suitable method is selected from these methods.

The cleaning agent of the invention is applied under the conditions suitably determined according to the concentration of the surfactant of the formula (I) in the cleaning agent to be used, the kind and amount of a flux to be removed, surface area or shape of the substrate, and the like. Usually the cleaning agent of the invention is brought into contact with a flux at a temperature and for a period of time effective to remove the flux. The temperature for cleaning is usually in the range of room temperature to about 80° C., and is preferably about 50° C. For removal of a flux by the immersion method at, e.g. about 50° C., a substrate bearing a flux is immersed in the cleaning agent of the invention for about 1 to about 5 minutes, whereby the flux can be eliminated effectively. The immersion at a higher temperature, of course, can reduce the period of time for cleaning and can improve the cleaning efficiency.

Following the cleaning operation, the substrate is then washed with water as a finishing step, whereby the surfactant portion remaining on the substrate is completely washed away. Such rinsing leads to high level of cleanness.

Such rinsing can be carried out in various ways, such as, by dipping in running water, dipping in water under application of ultrasonic wave, spraying with water or the like. Rinsing is conducted at a temperature and for a period of time effective to remove the cleaning agent and to thereby achieve a high degree of cleanness. The rinsing is usually conducted at a temperature ranging from room temperature to about 70° C. When the rinsing is conducted by showering or dipping, the time required for completion of the rinsing is usually about 30 seconds to about 5 minutes. In any event, the rinsing is continued until the substrate becomes clean enough for a particular purpose.

The cleaning agent of the invention can exhibit a flux-removing effect higher than or at least as high as conventional halogenated hydrocarbon type cleaning agents and can accomplish a high degree of flux removal.

The present invention can additionally provide the following advantages.

(1) The cleaning agent of the invention is halogen-free and does not pose the ozone depletion problem as caused by flon-type cleaning agents.
(2) The cleaning agent of the invention has a high flash point so that a commercially available cleaning device designed for a flon can be employed as it is or as properly modified, eliminating the need for a specially designed explosion proof cleaning device.
(3) The cleaning agent of the invention involves substantially no emission of odor, hence satisfactory in this regard.

According to the invention, there are provided a halogen-free flux-cleaning agent outstanding in a cleaning property and fully satisfactory in properties meeting environmental quality standard in respect of environmental disruption, inflammability, odor, etc. as well as a cleaning method using the cleaning agent.

The present invention will be described below in more detail with reference to the following examples to which the scope of the invention is not limited.

EXAMPLE 1

A polyethylene glycol alkyl ether-based nonionic surfactant which is an adduct of 1 mole of a $C_{10}$ to $C_{12}$ alcohol mixture with 3 moles of ethylene oxide was used as a cleaning agent of the invention.

A rosin-based flux (active flux containing 0.15 wt % of halides, trade name "Resin Flux #77-25", product of LONCO Co., Ltd.) was applied to the entire surface of a printed circuit board prepared from a copper-clad laminate and having thereon an exposed circuit portion and a non-circuit portion coated with a solder resist, and then dried at 130° C. for 2 minutes and subjected to soldering at 260° C. for 5 seconds to produce a test board.

The test board was immersed for 1 minute in the foregoing cleaning agent adjusted to 50° C. and the degree of removal of the flux was inspected with the unaided eye and evaluated according to the following criteria. Table 1 shows the results.
A: The flux was removed to a satisfactory extent.
B: A little quantity of the flux remained unremoved.
C: A considerable quantity of the flux remained unremoved.

Subsequently, the test board was washed with showering water and dried at room temperature for 30 seconds, and the cleanness (concentration of the residual ions) of the test board was determined according to MIL P28809 with use of an Omega-meter 600 SE (trade name for a product of KENKO Co., Ltd.). Table 1 shows the results.

EXAMPLES 2 to 9

The degree of removal of flux and the cleanness of the test board were evaluated in the same manner as in Example 1 with the exception of changing the kind of the cleaning agents as shown in Table 1. Table 1 shows the results.

EXAMPLES 10 and 11

The degree of removal of flux and the cleanness of the test board were evaluated in the same manner as in Example 1 with the exception of using a mixture prepared by mixing 5 parts (Example 10) of water with 95 parts of the surfactant or by mixing 50 parts (Example 11) of water with 50 parts of the surfactant.

COMPARATIVE EXAMPLE 1

The test board as used in Example 1 was treated with an azeotropic mixture of CFC (chlorofluorocarbon) 113 and ethanol (trade name: FREON TE, product of Mitsui-Dupont Fluorochemical Co., Ltd.) for cleaning at room temperature under the conventional condition that requires no step for rinsing with water. Then the degree of removal of flux and the cleanness of the test board were evaluated in the same manner as in Example 1. Table 1 shows the results.

TABLE 1

| | Cleaning agent | | Cleaning temperature (°C.) | Degree of removal | Degree of cleaning - Contamination of equivalent NaCl ($\mu$g/inch$^2$) |
|---|---|---|---|---|---|
| | Kind of alcohol | Average number of moles of EO* added | | | |
| Ex. 1 | Mixture of $C_{10}$–$C_{12}$ alcohols | 3 | 50 | A | 4.7 |
| Ex. 2 | Mixture of $C_{10}$–$C_{12}$ alcohols | 6 | 50 | A | 4.1 |
| Ex. 3 | Mixture of $C_{10}$–$C_{12}$ alcohols | 9 | 50 | A | 5.0 |
| Ex. 4 | Mixture of $C_{12}$–$C_{14}$ alcohols | 3 | 50 | A | 4.7 |
| Ex. 5 | Mixture of $C_{12}$–$C_{14}$ alcohols | 9 | 50 | A | 4.8 |
| Ex. 6 | Decyl alcohol | 6 | 50 | A | 4.8 |
| Ex. 7 | Lauryl alcohol | 6 | 50 | A | 4.9 |
| Ex. 8 | Oleyl alcohol | 9 | 50 | A | 5.0 |
| Ex. 9 | Hexadecyl alcohol | 9 | 50 | A | 4.9 |
| Ex. 10[1)] | Mixture of $C_{10}$–$C_{12}$ alcohols | 3 | 50 | A | 4.7 |
| Ex. 11[2)] | Mixture of $C_{10}$–$C_{12}$ alcohols | 3 | 50 | A | 6.0 |
| Comp. Ex. 1 | CFC 113-ethanol azeotropic mixure | | Room temperature | A | 11.7 |

(Note)
*"EO" stands for ethylene oxide
[1)]mixture of surfactant (95 parts) and water (5 parts)
[2)]mixture of surfactant (50 parts) and water (50 parts)

It is claimed:

1. A cleaning method for removing a rosin-base flux on a printed wiring board, the method comprising bringing a cleaning agent into contact with the flux, the cleaning agent consisting essentially of a surfactant represented by the formula $$R-O-(CH_2CH_2O)_n-H \qquad (I)$$

wherein R is a straight or branched chain alkyl or alkenyl group having 5 to 18 carbon atoms and n is an integer of 2 to 12.

2. A cleaning method according to claim 1 wherein R is a straight or branched chain alkyl or alkenyl group having 10 to 16 carbon atoms.

3. A cleaning method according to claim 1 wherein n is an integer of 3 to 9.

4. A cleaning method according to claim 1 wherein R is a straight or branched chain alkyl group having 10 to 14 carbon atoms, and n is an integer of 3 to 9.

5. A cleaning method according to claim 1 wherein the cleaning agent further contains water.

6. A cleaning method according to claim 5 wherein the cleaning agent contains the surfactant of the formula (I) at a concentration of more than about 50% by weight but less than 100% by weight.

7. A cleaning method according to claim 1 wherein the cleaning agent is brought into contact with the rosin-base flux for a time period and at a temperature effective for removal of the flux.

8. A cleaning method according to claim 1 wherein the cleaning agent is brought into contact with the flux at a temperature of about 50° C.

9. A cleaning method according to claim 1 which further comprises the step of washing the printed wiring board with water.

* * * * *